(12) United States Patent
Fujinoki et al.

(10) Patent No.: US 6,483,639 B2
(45) Date of Patent: *Nov. 19, 2002

(54) OPTICAL SYSTEM FOR INTEGRATED CIRCUIT FABRICATION

(75) Inventors: Akira Fujinoki, Koriyama (JP); Hiroyuki Nishimura, Koriyama (JP)

(73) Assignees: Heraeus Quarzglas GmbH, Hanau (DE); Shin-Etsu Quartz Products Co, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/194,536

(22) PCT Filed: Mar. 23, 1998

(86) PCT No.: PCT/EP98/01692

§ 371 (c)(1),
(2), (4) Date: Nov. 25, 1998

(87) PCT Pub. No.: WO98/43135

PCT Pub. Date: Oct. 1, 1998

(65) Prior Publication Data

US 2001/0030798 A1 Oct. 18, 2001

(30) Foreign Application Priority Data

Mar. 25, 1997 (JP) ................................. 9/60235
Mar. 25, 1997 (JP) ................................. 9/90232

(51) Int. Cl.[7] ............................. G02B 6/00; G03F 7/20
(52) U.S. Cl. ....................... 359/355; 359/350; 359/361; 250/492.2
(58) Field of Search ................................. 359/350–361; 65/3.11, 399; 355/52–64

(56) References Cited

U.S. PATENT DOCUMENTS

| 5,703,712 A | * 12/1997 | Komine et al. ............. 359/350 |
| 5,912,725 A | * 6/1999 | Tanitsu ....................... 355/53 |
| 6,031,238 A | * 2/2000 | Fujinoki et al. .......... 250/492.2 |
| 6,061,174 A | * 5/2000 | Shiozawa er al. .......... 359/355 |

FOREIGN PATENT DOCUMENTS

| EP | 61129828 | 6/1986 |
| EP | 0401845 | 12/1990 |
| EP | 0483752 | 5/1992 |
| EP | 8005801 | 1/1996 |
| EP | 8078319 | 3/1996 |

OTHER PUBLICATIONS

Masaomi Kameyama, "The Way to One–Half Micrometer Photolithography", Apr. 1987, vol. 26 No. 4, pp. 304–310, Optical Engineering.

* cited by examiner

*Primary Examiner*—Thong Nguyen
(74) *Attorney, Agent, or Firm*—Milde & Hoffberg LLP

(57) ABSTRACT

An optical system for integrated circuit fabrication comprises optical members made of synthetic quartz glass and fluorite, wherein: an optical member disposed in a position through which laser light is transmitted at a high light energy density, is made of single crystal fluorite; and an optical member in a position through which laser light is transmitted at a low light energy density, is made of synthetic quartz glass containing approximately such a hydrogen molecule concentration as can be doped under atmospheric pressure.

17 Claims, 2 Drawing Sheets

OPTICAL SYSTEM FOR INTEGRATED CIRCUIT FABRICATION

FIELD OF INDUSTRIAL APPLICATION

The present invention relates to an optical system for fabrication of an integrated circuit of a capacity of 64 M bits to 254 M bits. More particularly, the present invention relates to an optical system for fabrication of an integrated circuit in which an integrated circuit pattern image is projected on a wafer using ultraviolet laser light of a short wavelength having a narrowed spectral band width with the help of an optical system made of quartz glass material.

PRIOR ART

Heretofore, an optical photolithographic technique, in which a pattern formed on a mask is transferred onto a wafer by illumination, has widely been used as an optical system for fabrication of an integrated circuit, owing to its advantage in cost compared with other techniques, such as those using an electron beam, an X-ray or the like.

While a projection aligner has been developed in a conventional photolithographic technique, said projection aligner using an i-line light of a wavelength of 365 nm emitted from a high pressure mercury lamp for depicting a patterned image with a line width of 0.5 to 0.4 $\mu$m, such a projection aligner corresponds to an integrated circuit (IC) of a capacity of 16 M bits to or less.

An IC of 64 M bits to 256 M bits of the first generation requires a resolution of 0.25 to 0.35 $\mu$m and an IC of 1 G bits requires a resolution of 0.13 to 0.20 $\mu$m. A resolution of 0.35 $\mu$m is not achieved by a wavelength of an i-line light and therefore, KrF light is used as a light source. In a region of a resolution better than 0.2 $\mu$m, ArF light is used instead of KrF light, especially an ArF excimer laser.

There are various problems in an photolithographic technique using an ArF excimer laser and one of them is a problem associated with an optical material constituting lenses, mirrors and prisms, which is used to construct an optical system for projection.

While an optical material which shows a good transmittance in a wavelength of 193 nm emitted from an ArF laser is substantially limited to quartz glass, especially high purity synthetic quartz glass, ArF light adversely affects quartz glass, damaging it ten times or more than KrF light does.

An improved resistance to excimer laser irradiation of quartz glass is dependent on a hydrogen concentration contained therein, as described in EP-A 401 845. In the publication, it is disclosed that quartz glass may be used to construct an optical system of a projection aligner using a KrF excimer laser as a light source which was able to secure enough resistance to the laser light with a hydrogen concentration of $5 \times 10^{16}$ molecules/cm³ or more contained therein.

However, since influence exerted on quartz glass by ArF laser light is extremely greater, compared with KrF laser light, as has been described above. It was found from an investigation into the degree of the damage, such as changes in transmittance and refractive index thereof produced in the bulk of synthetic quartz glass required hydrogen concentration for preventing occurrence of the damage of 100 to 1000 times or more as large as the hydrogen molecule concentration required in the case of a KrF excimer laser light, specifically $5 \times 10^{18}$ molecules/cm³ or more.

There are two methods to make synthetic quartz glass incorporating hydrogen molecules. In one of the methods, wherein hydrogen molecules are incorporated into the synthetic quartz glass in atmospheric pressure, adjusting the environment in production, the maximum concentration of hydrogen molecule to be incorporated, is on the order of $5 \times 10^{18}$ molecules/cm³. In the other method, wherein hydrogen molecules are incorporated into the quartz glass by a heat treatment in a pressured hydrogen atmosphere, the upper limit of an incorporated hydrogen molecule concentration is the same $5 \times 10^{18}$ moleculeslcm³ under a pressure of 10 atm as well, when the pressure is its maximum under Japanese Law of High Pressure Gas Control.

In such circumstances, if a hydrogen molecule concentration of $5 \times 10^{18}$ molecules/cm³ or more is desired, it is required that quartz glass is subjected to a heat treatment at a temperature of 1000° C. or higher and in a high-pressure hydrogen atmosphere of 100 atm or higher as described in EP-A 483 752.

However, since a heat treatment at 1000° C. or higher under a pressure of 100 atm or higher provokes new defects in the bulk of quartz glass, a temperature of the heat treatment preferably is in the range of 200 to 800° C. (see Publication of Unexamined Japanese Patent Application No. Hei 6-166528). In the case where a great number of hydrogen molecules, which is $5 \times 10^{18}$ molecules/cm³, are incorporated into quartz glass by a heat treatment at a temperature in this range in a hydrogen atmosphere, there arises a fault that it takes very long to incorporate hydrogen molecules in the quartz glass to such a concentration, since a diffusion coefficient of a hydrogen molecule is not so large and in addition, to conduct a heat treatment in a high pressure atmosphere results in not only decrease of homogeneity in refractive index in the bulk of the quartz glass but also generation of strains in the bulk.

Therefore, if quartz glass is subjected to a high-pressure, high-temperature treatment, as a result another heat treatment becomes necessary for readjustment. These treatments make the process to produce quartz glass which is suitable for constituting an optical system of a projection aligner industrially very complex and time-consuming, which in turn makes the quartz glass having a hydrogen concentration of $5 \times 10^{18}$ molecules/cm³ or more, a homogeneity in refractive index, a low level of strains and the like, highly expensive.

However even if the quartz glass having hydrogen concentration of $5 \times 10^{18}$ molecules/cm³ or more, optical properties, such as a homogeneity in refractive index, a low level of strains and the like, is obtained, a volume constriction causing a change in refractive index of the quartz glass may arise during irradiation by ArF light.

A technique to combine synthetic quartz and fluorite in an optical system used for integrated circuit fabrication has been disclosed in Publication of Unexamined Japanese Patent Application No. Hei 8-78319 (hereinafter referred to as first prior art technique), but the technical concept is essentially different from that of the present invention.

The first prior art technique is to constitute the optical system for exposure with a diffraction optical element having a positive power, a quartz lens having a negative power and a fluorite lens having a positive power, which constitution is to correct a chromatic aberration. In the first prior technique, the chromatic aberration is corrected by a combination of a diffraction optical element and a refracting lens respectively having positive and negative powers, and a fluorite having a positive power, wherein a combination of optical elements, different from one another in optical dispersion corrects chromatic aberration. Such a combination specially realizes an optical system having an image formation property that a secondary spectrum of chromatic aberration is minor and thereby not only can a larger curvature radius of a lens, a larger NA, a larger field of view be realized to give room to improvement on a specification of the optical system but a tolerance of eccentricity in fabrication is also larger to promote easy fabrication.

SUMMARY OF THE INVENTION

It is an object of the present invention to provide an optical system for use with ultraviolet light of a short wavelength with a narrowed spectral band width, especially ArF laser light, as illumination in the projection aligner without degrading properties such as durability, optical transmittance and the like with a low cost and ease as a whole.

In the present invention the optical system is constructed of a combination of synthetic quartz glass and fluorite.

Therefore, since the first prior art technique is one in which a quartz glass lens having a negative power and a fluorite lens having a positive power are combined from the view point of solving problems in design and fabrication, it is different from the present invention in that the present invention has the object to prevent degradation in resistance to laser light caused by high output irradiation. Therefore, the prior art is also confirmed to be different in constitution on the basis of the different objects, as mentioned above.

In order to improve resistance to laser light, according to a first aspect of the present invention, an optical system comprises a combination of optical members made of synthetic quartz glass and fluorite, wherein: a crystalline optical member, which is located in a position through which laser light is transmitted at a relatively high light energy density $\epsilon$ (mJ/cm$^2$) (hereinafter referred to as wafer side optical member), is made of fluorite to avoid being broken under irradiation of ArF laser light; and an amorphous optical member, which is located in a position through which laser light is transmitted at a relatively low light energy density $\epsilon$ (mJ/cm$^2$) (hereinafter referred to as light source side optical ember), is made of synthetic quartz glass having a hydrogen molecule concentration in the range of $1 \times 10^{17}$ molecules/cm$^3$ to $5 \times 10^{18}$ molecules/cm$^3$.

The relatively low hydrogen content of the quartz glass of the amorphous optical member can be simply achieved by doping the quartz glass in atmospheric pressure. As a result it is more easy to establish a high quality of the optical properties of the quartz glass, especially to attach importance to homogeneity of refractive index. The entire optical system achieves high transmittance.

More preferably, the optical system comprises optical members made of a plurality of qualities of synthetic quartz glass and an optical member made of a kind of fluorite, wherein the fluorite has a homogeneity of refractive index $\Delta n$ of $3 \times 10^{-6}$/cm or less and a birefringence of 2 nm/cm or less; a first quality of synthetic quartz glass has a hydrogen molecule concentration in the range of $5 \times 10^{17}$ molecules/cm$^3$ to $5 \times 10^{18}$ molecules/cm$^3$, a homogeneity of refractive index $\Delta n$ of $2 \times 10^{-6}$/cm or less and a birefringence of 1 nm/cm or less; and a second quality of synthetic quartz glass has a hydrogen molecule concentration in the range of $1 \times 10^{17}$ molecules/cm$^3$ to $5 \times 10^{18}$ molecules/cm$^3$, a homogeneity of refractive index $\Delta n$ of $2 \times 10^{-6}$/cm or less and a birefringence of 1 nm/cm or less.

That is, while according to the present invention, in a high energy level region of laser light, fluorite having resistance to a change in transmittance of laser light, especially single crystal fluorite due to absolutely no volume constriction over time is observed instead of quartz glass, it is extremely difficult to achieve such optical properties as homogeneity in refractive index, low birefringence and the like for a large diameter optical member used in photolithography when fluorite is used as the material.

If synthetic quartz glass capable of being doped under atmospheric pressure and having high homogeneity is used in a low energy level region of laser light, resistance to a change in transmittance and high homogeneity can be maintained in the entire optical system.

As a relation between fluorite and synthetic quartz glass in terms of a measure of homogeneity such as a refractive index An or a birefringence nm/cm, it is preferred that the homogeneity is set better in the synthetic quartz glass used as an amorphous optical member than in the fluorite used as an crystalline optical member, in other words, a measure of homogeneity is set better in a light source side-optical member than a wafer side-optical member. In a more definite manner, it is preferred that a wafer side-optical member is of single crystal and has a homogeneity of refractive index $\Delta n$ of $3 \times 10^{-6}$/cm or less and a birefringence of 2 nm/cm or less, and a light source side-optical member is of synthetic quartz glass and has a homogeneity of refractive index $\Delta n$ of $2 \times 10^{-6}$/cm or less and a birefringence of 1 nm/cm or less.

Generally, excimer laser light has a spread in oscillating wavelength and accordingly, unless the spread in oscillating wavelength is restricted to a narrow band width in a monochromatic lens system, a material of whose constituent lenses is only quartz, chromatic aberration arises. Therefore the present invention employs an ArF excimer laser light which is ultraviolet light of a short wavelength having an oscillating wavelength width of 1.5 pm or less (FWHM or full width at half maximum).

The fluorite used as an optical member can secure an internal transmittance per cm of about 98%/cm after irradiation of the pulsed laser light having a wavelength of 193 nm at an energy density per pulse of 50 mJ/cm$^2$ for a pulse count of $1 \times 10^6$.

In order to improve resistance to laser light, according to a further aspect of the present invention, an optical system for circuit pattern exposure of ArF excimer laser light having a wavelength of 193 nm is provided, wherein the average transmittance of the optical system as a whole is about 98.0%/cm or more, the transmittance of the at least one amorphous optical member is 99.5%/cm or more and the transmittance for the crystalline optical member is 99.8%/cm or more, whereby at least one amorphous optical member belonging to the second quality is disposed in a region through which the laser light is transmitted at an energy density of $\epsilon \leq 0.1$ mJ/cm$^2$, and at least one amorphous optical member belonging to the first quality is disposed in a region, through which the laser light is transmitted at an energy density of $0.1 < \epsilon < 0.4$ mJ/cm$^2$, and the at least one crystalline optical member is disposed in a region, through which the laser light is transmitted at an energy density of $\epsilon \geq 0.4$ mJ/cm$^2$.

Besides, in order to achieve homogeneity in refractive index in the entire optical system and more particularly, maintain a change in the average refractive index at a low value, the optical members are preferably so arranged in combinations that the optical system comprises an overall optical path length composed of total optical path lengths of the at least one crystalline optical member and of the at least one amorphous optical member, wherein the total optical path length of the at least one crystalline optical member is set at 25% or less of the overall optical path length and the total optical path length of the at least one amorphous optical member belonging to the second quality is set at 50% or more of the total optical path length. Preferably the average variation of refractive index An of the optical system is set at a value of $\Delta n \leq 2.0 \times 10^{-6}$/cm.

PREFERRED EMBODIMENTS OF THE INVENTION

Examples of the present invention will be described referring to the accompanying drawings.

It is to be understood that, unless otherwise specified, the sizes, materials and shapes of constructing parts, relative configuration therebetween and the like are described without any sense of restricting the present invention thereto but are exemplary only.

Figure 1:
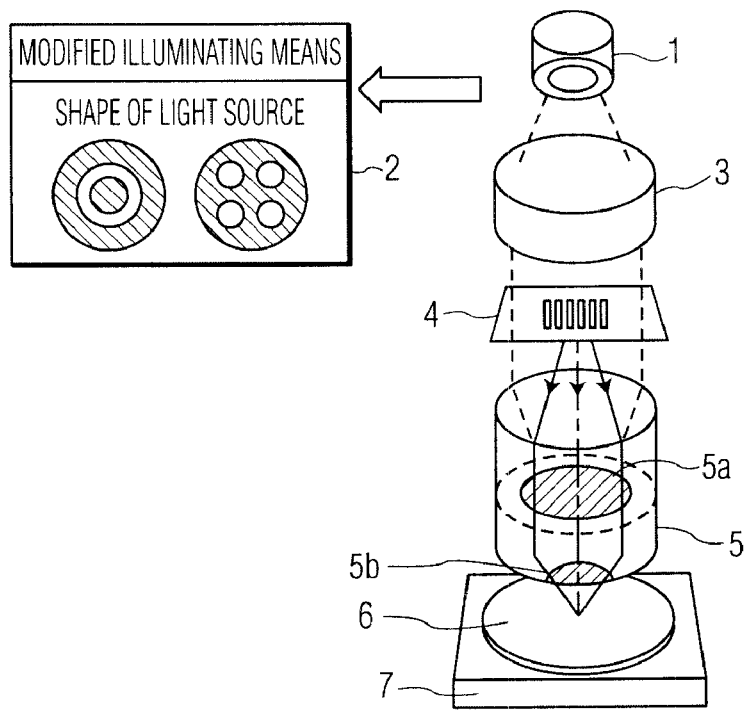
FIG. 1 is a schematic view showing a structure of an optical system for fabricating Integrated circuits using refractive optics to which the present invention is applied.

FIG. 1 is a schematic view showing a structure of a photolithographic projection aligner using an ArF laser as a light source (for information of the fundamental structure of the projection aligner, see an article entitled "optical resolution technique in photolithography" in No. 182.0 plus E, the special issue on the leading edge of the lithographic technology 1). In the figure, 1 indicates an ArF excimer laser, 2 indicates a modified illumination means for formation of a pattern image on a wafer without any interference of diffracted light, which illumination means comprises a light source plane of, for example, quadrupole or ring illumination as viewed in sectional shape with a light-intercepting part in the central portion of the plane.

A numeral reference 3 indicates a condenser lens, which conducts an excimer laser beam emitted from the above-mentioned light source to a recticle, 4 indicates a mark (reticle), 5 indicates a refractive optical system, wherein, for example, a group of lenses with a positive refraction and another group of lenses with a negative refraction are combined in efforts to attain a narrower spectral band width and a pupil plane is formed in the refractive optical system so as to achieve an improved resolution. 6 indicates a wafer placed on a wafer stage 7 and a mask pattern depicted on the reticle 4 is projected on a wafer 6 to form an pattern image with the help of the refractive optical system 5.

In such a projection aligner, the ArF excimer laser light source can emit excimer laser light having a spectral band width as narrow as a width of 1.0 to 1.5 pm by arranging wavelength selecting elements, such as a prism, a diffraction grating and an etalon in a resonator of the laser in a well known manner (see Optical and Quantum Electronics, Vol. 25 (1993) pp. 293 to 310).

The refractive optical system 5 comprises a group of condenser lenses 5a mounted in the closest position to a plane of the reticle, a group of lenses 5b mounted in the vicinity of the pupil plane, on which pupil plane a secondary light source is formed, said secondary light source being an image of the light source. Accordingly, if the light source image is formed in a dispersed manner in the pupil plane, local concentration of light energy is created and it can be one of causes for breakage of not only a portion of the wafer side, but also a portion of the entire optical system.

On the reticle side of the optical system, operational conditions are milder than those on the wafer side, since an energy density is less by a factor of the second order of an imaging magnification.

In this example, such points as above-mentioned are considered. That is, it is reasonable that an energy density is determined by a magnification to an area of a pupil plane, wherein, according to a reference article, a size of the pupil plane of an ArF excimer laser is in the range of 30 to 50 mm in diameter.

Provided that a reticle sensitivity is, for example, in the range of 20 to 50 mJ and a photoresist film is exposed to 20 to 30 pulse laser irradiation, an energy density per pulse on the pupil plane is 0.6 to 1.7 mJ/cm$^2$. An energy density per pulse in the lenses located in the closest position to the surface of the wafer is, in practice, estimated to be in the range of 75 to 90% of the above energy density, that is, in the range of 0.4 to 1.5 mJ/cm$^2$, even when it is assumed that, to be exact, there is a difference between energy densities on an image-forming plane and the pupil plane and the energy density on the wafer plane is a little larger than on the pupil plane. An energy density on the pupil plane seems to be less than the range of 0.4 to 1.5 mJ/cm$^2$ by a small difference.

The refractive optical system is constructed with a combination of a group of lenses having a positive refraction and a group of lenses having a negative refraction for an improved resolution (see, for example, GB-A 2,153,543). In this case, removal of aberrations of the groups of lenses is required to a great extent and, for the purpose, magnifications of enlargement or reduction of respective lenses incorporated in the groups are properly selected in moderate ranges. In consideration of such circumstances, an energy density in a group of lenses in a position next to the closest position to the wafer side or pupil plane is estimated to be in the range of about one third of the above-mentioned range of 0.4 to 1.5 mJ/cm$^2$, that is, in the range of 0.1 to 0.4 mJ/cm$^2$.

An energy density per pulse $\epsilon$ in almost all the other groups of lenses, including lenses on the light source side is $\leq 0.1$ mJ/cm$^2$.

In the above conditions of energy densities per pulse, the resolution of the entire optical system can be improved by attaching much importance to optical transmittance rather than to durability for a group of lenses having an energy density per pulse $\epsilon \leq 0.1$ mJ/cm$^2$ among groups of lenses on the wafer side.

Therefore, in the case of synthetic quartz glass constituting light source side optical members at $\epsilon \leq 0.1$ mJ/cm$^2$ in this embodiment, while a hydrogen molecule concentration $C_{H2}$ is set at a value as low as in the range of $1 \times 10^{17} \leq C_{H2} \leq 5 \times 10^{18}$ molecules/cm$^3$, and a refractive index ($\Delta$n) and a birefringence are set at respective values as of high quality as $\leq 1 \times 10^{-6}$ and $\leq 1.0$ nm/cm, a transmittance of light at a 193 nm, which is a wavelength of a ArF laser, is set at a value as mild as 99.5% or more.

Groups of lenses in the vicinity of the pupil plane and lenses in the closest position to the wafer whose energy density per pulse $\epsilon$ is $\leq 0.4$ mJ/cm$^2$ are important to durability so that durability of the entire optical system may be improved.

In the case of an optical member in the example, where an optical member, such as a lens, at $0.4 \leq \epsilon$, is made of single crystal fluorite having a refractive index ($\Delta n$) and a birefringence respectively set at values as mild as $\leq 3 \times 10^{-6}$ and $\leq 2.0$ nm/cm in order to achieve easy manufacture, light transmittance at 193 nm of a wavelength of ArF laser light is maintained at 99.8% or more.

For optical members such as lenses, which are disposed in a position next to lenses at a high energy density per pulse of receiving light, and which are located in a position at an energy density per pulse $\epsilon$ of received light in the range of $0.1 < \epsilon < 0.4$ mJ/cm$^2$ between the above-mentioned ranges, a concentration of hydrogen molecules $C_{H2}$ is moderately set in the range of $5 \times 10^{17} \leq C_{H2} \leq 5 \times 10^{18}$ molecules/cm$^3$, a distribution of refractive index ($\Delta n$) and birefringence are respectively set at values as mild as $\leq 2 \times 10^{-6}$ and $\leq 1.0$ nm/cm and a transmittance at 193 nm, which is a wavelength of ArF laser light, is set at 99.5% or more, which is a value a little milder so as to make manufacture of the optical system easier.

It is preferred that groups of optical members having different optical properties be arranged in an optical system in such a combination that a total length of optical path through optical members under $0.4 \leq \epsilon \leq 1.5$ mJ/cm$^2$ is equal to or less than 25% of the total length through the entire optical system and a total length of optical path through optical members under $0.1 < \epsilon < 0.4$ mJ/cm$^2$ is equal to or less than 25% of the total length through the entire optical system in order to attain high transmittance through the entire optical system, while durability is secured, as described later in examples.

When a material of lenses constituting the optical system using refractive optics is considered, how severe a degree of deterioration of a lens is, has to be determined in reference to the diameter of a lens. According to the reference article already referred in this specification, the size of a pupil plane of an ArF laser is in the range of 30 to 50 mm in diameter and it is reasonable that a magnification to the area as a divisor is adopted for a normalization.

A diameter of a lens in a close position to a pupil plane or a wafer surface receiving ArF excimer laser light of an energy density of $0.4 \leq \epsilon$ (mJ/cm$^2$), more particularly of $0.4 \leq \epsilon \leq 1.5$ mJ/cm$^2$ is on the order of 80 mm in diameter as the maximum, if it is considered that the maximum size of a pupil is 50 mm in diameter and a used area of the lens for receiving the light is 80% of the actual area. It is reasonably estimated from the above discussion that a lens diameter at an energy density of $0.4 \leq \epsilon \leq 1.5$ mJ/cm$^2$ of ArF laser light is about 80 mm or less.

According to a similar calculation to the above, in the case of a lens or the like at the energy density $\epsilon$ of $0.1 < \epsilon <$ mJ/cm$^2$ a magnification to a pupil plane area is on the order of 2 to 3 and thus a diameter of the lens corresponds to 80 to 100 mm in diameter.

In the case of a lens having a larger diameter than this (100 mm in diameter), an energy density in the lens is naturally a value as small as $\epsilon \leq 0.1$ mJ/cm$^2$.

In this case, too, it is preferable to set so that a total length of optical path through optical members, such as lenses and the like, equal to or less than 80 mm in diameter is 20% or less of the total length of optical path of the entire optical system and that of optical members from 80 mm to 100 mm in diameter is 25% or less.

The present invention may be applicable to a projection aligner using reflective optics in addition to the projection aligner using refractive optics shown in FIG. 1.

Figure 2:
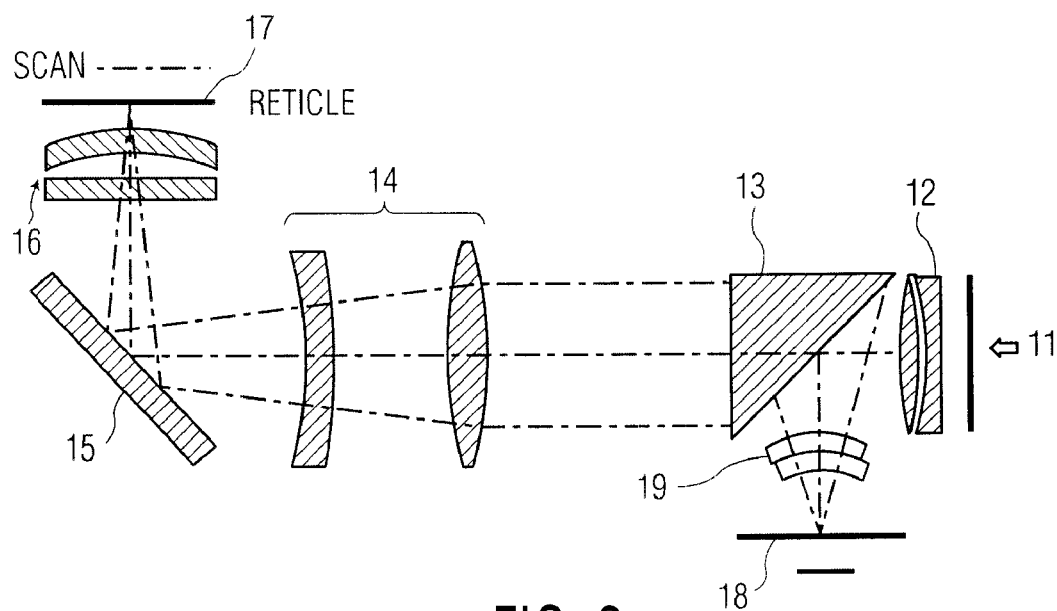
FIG. 2 is a schematic view showing a structure of an optical system for fabricating integrated circuits using reflective optics to which the present invention is applied.

FIG. 2 is a schematic diagram showing a configuration of lenses and the like of an optical system using reflective optics, in which the aligner uses a beam splitter of a prism type in order to attain a high resolution (for information of the fundamental structure of the projection aligner, see an article entitled "optical resolution technique in photolithography" in No. 182.0 plus E, the special issue on the leading edge of the lithographic technology 1). Simply described, a beam is emitted from a light source 11 and the beam passes firstly through a first group of lenses 12, secondly through the beam slitter 13, thirdly through a second group of lenses 14 and then reaches a mirror 15. The beam is deflected at the mirror 15 and condensed with a third group of lenses 16. Thereafter, a recticle 17 is scanned by the condensed beam and after scanning the reflected beam passes back again through the third group of lenses 16, reaches the mirror 15 to be reflected and again passes through the second group of lenses 14 to reach the beam splitter 13. The beam is at this time deflected in the beam splitter 13 and passes through a fourth group of lenses 19 to form a pattern image of integrated circuits on a wafer 18, which image results in a resist pattern after activation of a photosensitive resist applied on the wafer and a treatment in a developer solution.

In such a projection aligner, as well, the ArF excimer laser light source can emit excimer laser light having a spectral band width as narrow as a width of 1.0 to 1.5 pm by arranging wavelength selecting elements, such as a prism, a diffraction grating and an etalon in a resonator of the laser in a well known manner.

Lenses made of single crystal fluorite are used as the fourth group of lenses 19 which are in the closest position to the wafer after the splitter 13 along the beam direction, since the fourth group of lenses 19 is under a condition at an energy density $\epsilon$ of $0.4 \leq \epsilon \leq 1.5$ mJ/cm$^2$ of the beam, which is the maximum intensity of the optical system and a refractive index ($\Delta n$) and birefringence are respectively set at values as mild as $\leq 3 \times 10^{-6}$ and $\leq 2.0$ nm/cm in order to make fabrication easier and a transmittance at 193 nm, which is a wavelength of ArF laser light, is set at 99.8% or more.

In the projection aligner, it is only required that the third group of lenses 16 has a hydrogen molecule concentration $C_{H2}$ in the range of $5 \times 10^{17} \leq C_{H2} \leq 5 \times 10^{18}$ molecules/cm$^3$, a distribution of refractive index $\Delta n$ as mild as $\leq 2 \times 10^{-6}$ and a birefringence as mild as $\leq 1.0$ nm/cm, since it is estimated that the beam with an estimated energy density per pulse $\epsilon$ in the range $0.1 < \epsilon < 0.4$ mJ/cm$^2$ passes through the recticle 17 side portion of the bulk of the third group of lenses 16, which estimation is based on a function that the beam is condensed by the third group of lenses 17 and then used for scanning the surface of the recticle 17. In other optical members of the optical system, such as the other lenses, mirror and beam splitter of a prism type, especially in the optical members close to the light source side thereof, a hydrogen molecule concentration $C_{H2}$ is set to be in the range of $1 \times 10^{17} \leq C_{H2} \leq 5 \times 10^{18}$ molecules/cm$^3$, a distribution of refractive index $\Delta n$ is set to be as of high quality as $\leq 1 \times 10^{-6}$ and a birefringence is set to be also as high as $\leq 1.00$ nm/cm, since such optical members are only affected by the beam with an energy density per pulse $\epsilon$ as low as $\epsilon \leq 0.1$ mJ/cm$^2$.

In the embodiment, a combination of diameters of groups of lenses is set, as described above, such that a total length of optical path through the fourth group of lenses 19, whose diameters are set at 80 mm or less, is 25% or less of the total length of optical length of the entire optical system and a total length of optical path through the third group of lenses, whose diameters are set in the range of 80 to 100 mm, is 25% or less of the total length of optical path of the entire optical system, whereby it is estimated that a transmittance through the entire optical system can be achieved at 99.8% or more, while durability thereof is secured.

EXAMPLES

Long term stability of optical properties in actual conditions was simulated by an acceleration test conducted in severer conditions on quartz glass optical members, such as a lens, mirror and prism, which were selected from an optical system incorporated in each of the projection aligners depicted in FIGS. 1 and 2, since a long term stability test on each of projection aligners depicted in FIGS. 1 and 2 takes a long time, if tested in actual operational conditions.

A progress speed of a damage by irradiation of laser light generally increases in proportion to the second power of an energy density of an irradiated excimer laser beam as in the teaching of an article printed in Japanese authored by Akira FUJINOKI with a title of "Quartz Glass for the Excimer Laser Use" appeared in "Optics", Vol. 23, No. 10. which is referred as "reference article 1." The acceleration test was conducted on the basis of the acceleration effect on the damage progress speed in the teaching.

First of all, description on optical materials used will be described.

Silicon tetrachloride was hydrolyzed in an oxygen/hydrogen flame and silica formed was further deposited on a rotating substrate to produce a quartz glass ingot, which is called DQ method.

The produced quartz glass ingot had OH groups at a concentration in the range of 800 to 1000 ppm and hydrogen molecules at a concentration of $5 \times 10^{18}$ molecules/cm$^3$. It received a homogenizing treatment comprising heating at 1150≈C. for 40 hours and gradual cooling by a method disclosed in EP-A1 673 888 in order to remove strains in the bulk.

Optical properties were measured on the homogeneous quartz glass obtained. According to the measurements, it was found that it had no striae in three directions, a very good homogeneity in refractive index distribution $\Delta n$ of $1 \times 10^{-6}$ was measured by an interferometer (ZYGO MARK IV) and a birefringence of 1 nm/cm or less was measured by a cross Nicols bi-refringence analyzer.

Such optical quartz glass meets requirements for optical properties of quartz glass used as material of optical members incorporated in an excimer laser stepper, which requirements are described in an article printed in Japanese with a title of "Quartz Glass for a Stepper", in New Glass, Vol. 6, No. 2 (1989) pp. 191–196. A projection aligner for semiconductor use having an ArF excimer laser as a light source can be constructed with optical members made of such optical quartz glass because of the quartz glass meeting the requirements.

The quartz glass thus produced was measured for hydrogen molecule concentration included therein by a laser Raman spectroscopic analysis and the concentration was found to be $5 \times 10^{17}$ molecules/cm$^3$ (a specimen used for the measurement is hereinafter called Sample A).

A hydrogen molecule concentration was measured by a Raman spectrophotometer. The Raman spectrophotometer used in the measurements was a Raman spectrophotometer NR 1100 made by Nihon Bunkou Kougyo K.K. and a photon counting method was adopted, wherein an Ar laser with an output of 700 mW at an excitation wavelength of 488 nm and a photon multilplier R943-02 made by Hamamatsu photonics K.K. were used. A measurement was conducted by conversion to a hydrogen molecule concentration of a ratio of integrated intensities between a scattering band of $SiO_2$ at a wave number of 800 cm$^{-1}$ and a scattering band of hydrogen in a range of 4135 to 4140 cm$^{-1}$ in wave number observed in a Raman scattering spectrum, wherein a conversion constant was $1.22 \times 10^{21}$ and, therefore, $C_{H2}$=Integral Intensity of $SiO_2$/Integral Intensity of Hydrogen times $1.22 \times 10^{21}$ said constant being reported in Zhurnal Pri-Kladnoi Spectroskopii, Vol. 46, No. 6, pp. 987–991. June 1987.

The above quartz glass was cut to prepare a specimen having a size of 60 mm in diameter and 20 mm in thickness. The specimen was oxidized in atmospheric air at 1000≈C for 20 hours and the oxidized specimen was subjected to a hydrogen doping treatment in a high pressure hydrogen atmosphere at 0.8 MPa (8 kgf/cm$^2$) at 600≈C for 1000 hours. The specimen thus treated was measured on a distribution of refractive index $\Delta n$, a birefringence and a hydrogen molecule concentration $C_{H2}$, which were respectively $2 \times 10^{-6}$, 2 nm/cm and $4 \times 10^{18}$ molecules/cm$^3$ (the specimen is hereinafter called Sample B). On the other hand, a high purity optical use fluorite having dimensions of 60 mm in diameter×20 mm in thickness of a UV grade article (for example, CaF$_2$/UV grade, Optron CaF$_2$/UV grade and the like manufactured by Ohyo Kohken Co.) is prepared and measurements on layer characteristics were conducted.

The measurements were conducted with ArF laser light having a narrowed spectral band width of 1.0 to 1.5 pm and a change in transmittance was measured under an irradiation condition of an energy density per pulse 50 mJ/cm$^2$ p, 300 Hz and 10$^6$ shots of the light.

Figure 3:
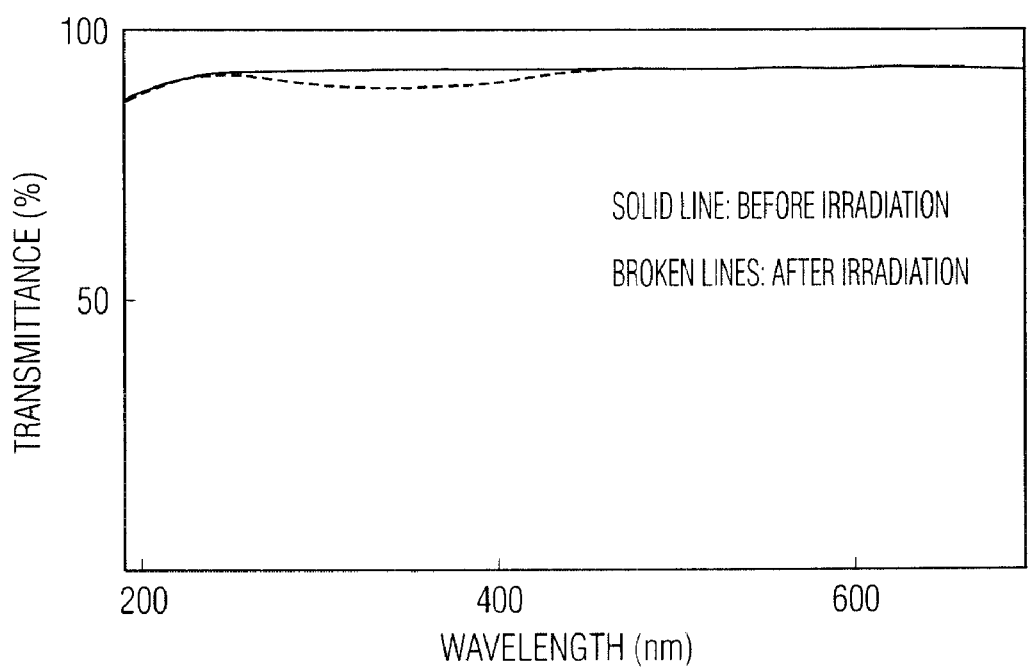
FIG. 3 is a graph showing an absorption band of fluorite of Sample C after laser irradiation in an example of the present invention.

It was found that even in fluorite of the same UV grade, while some had a small absorption at 200 nm, but large absorptions at 320 nm and 380 nm, others had none of the absorptions. As shown in FIG. 3, on Sample C, a transmittance after the irradiation was measured as a good value of 99.0% at 193 nm, but on Sample D, very large absorption bands at 250 nm and 370 nm appeared and a transmittance was 95.3% at 193 nm.

Homogeneities of refractive index $\Delta n$ of Samples C, D are both $2 \times 10^{-6}$ or less and birefringences are both 2 nm or less. Transmittance at 193 nm before laser irradiation was a good value of 99.8%.

An estimation of a lifetime of an optical system constituting an projection aligner was carried out using the samples A to D by experiments.

In the experiments, changes in optical properties, particularly changes in transmittance and in refractive index at 193 nm are measured as acceleration tests in which ArF excimer laser light is irradiated on the samples A to D in conditions at an energy density of 50 mJ/Cm$^2$ p and 300 Hz and for $1 \times 10^6$ pulses.

The above mentioned conditions correspond to an acceleration test with a factor of $(100/\epsilon)^2$, where an energy density of laser light transmitted through an optical member in the actual working condition is $\epsilon$ mJ/cm$^2$, as shown in the reference article 1.

The results are shown in Table 1. An assumed energy density appears in the table and indicates a conceived energy density which is actually to be used in an optical member for estimation and estimated values for changes in transmittance and refractive index are those obtainable in conditions for $5 \times 10^{10}$ shots at the conceived energy density.

TABLE 1

| Samples | Decrease in Transmittance | Change in Refractive Index | Assumed Energy Density | Estimation of Change in Transmittance | Estimation of Change in Refractive Index |
|---|---|---|---|---|---|
| A | 2.9% | $2.5 \times 10^{-5}$ | 0,1 | 99.4% | $5.0 \times 10^{-7}$ |
|   |      |                       | 0,4 | 91.0% | $8.0 \times 10^{-6}$ |
|   |      |                       | 0,8 | 68.7% | $3.2 \times 10^{-6}$ |
| B | 1.0% | $6.6 \times 10^{-7}$ | 0,4 | 96.8% | $2.1 \times 10^{-6}$ |
|   |      |                       | 0,6 | 87.9% | $8.4 \times 10^{-6}$ |
| C | 1.0% | 0 | 0,6 | 98.9% | 0 |
| D | 8.3% | 0 | 0,6 | 86.7% | 0 |

Combinations in which a high transmittance is kept and a stability of refractive index is maintained over a long time in use were investigated in the cases of optical systems for reducing an image, said combinations of optical members being considered from the above mentioned experiments. The results are own in Table 2, described below:

TABLE 2

|   | $0.1 \geq \epsilon$ | $0.1 < \epsilon < 0.4$ | $\epsilon \geq 0.4$ | Overall Transmittance %/cm | Average Change in Refractive Index | Overall Appraisal |
|---|---|---|---|---|---|---|
| 1 | A | A | A | 88.7 | $1.0 \times 10^{-5}$ | X |
| 2 | A | A | B | 94.3 | $4.3 \times 10^{-6}$ | X |
| 3 | A | A | C | 97.1 | $2.2 \times 10^{-6}$ | Δ |
| 4 | A | B | B | 95.8 | $2.8 \times 10^{-6}$ | X |
| 5 | A | B | C | 98.6 | $1.3 \times 10^{-6}$ | ○ |
| 6 | A | B | D | 95.6 | $1.0 \times 10^{-6}$ | X |

As can be seen from the table 2, when a combination of [A+B+C] in No. 5 is selected in the respective cases of small $0.1 \geq \epsilon$, medium $0.1 < \epsilon < 0.4$ and large $0.4 \leq \epsilon$, an overall average transmittance and average change in refractive index are respectively 98.6%/cm and $1.3 \times 10^{-8}$/cm, which satisfy requirements for standard values.

When a combination of [A+A+C] in No. 3 is selected, an overall transmittance and average change in refractive index are respectively 97.1% and $2.2 \times 10^{-6}$/cm. any of which is outside the requirements for standard values, but it can be said that they almost satisfy the requirements. Especially in an actual image forming optical system, since laser light densities at which laser light is transmitted through lenses are different according to a design of the optical system, there is the case where even a combination of [A+A+C] can be endurable in a practical sense.

Figure 4:
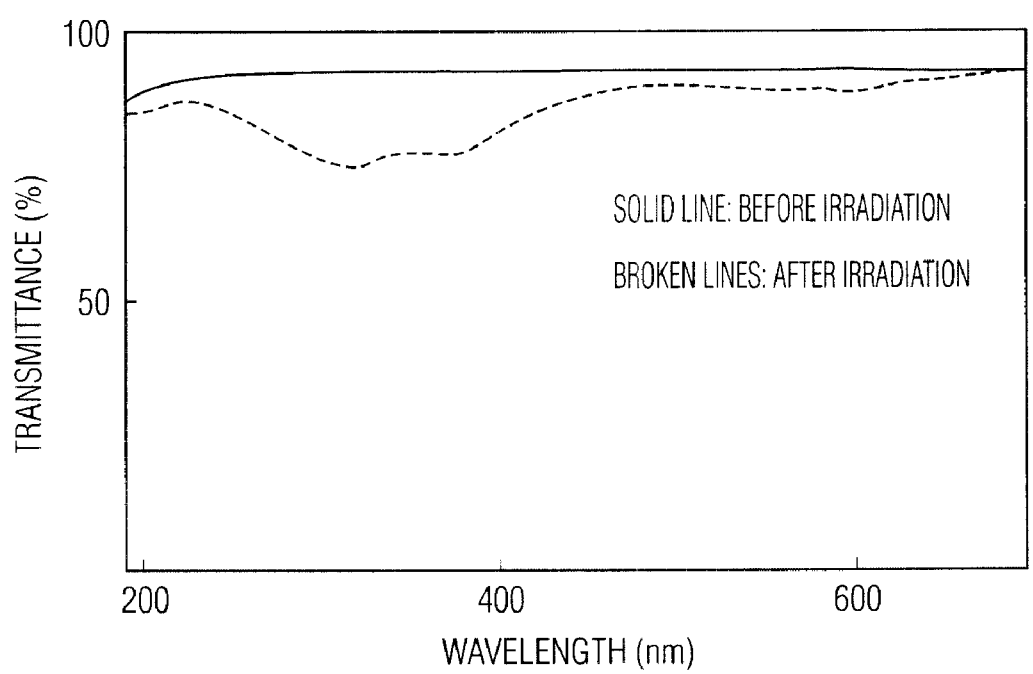
FIG. 4 is a graph showing an absorption band of fluorite of Sample D after laser irradiation in a comparative example of the present invention.

While No. 6 is a combination of a plurality of qualities of synthetic quartz glass [A+B] and fluorite D, that is a combination of [A+B+D], an overall transmittance is 95.6%/cm, which is outside a requirement for a standard value. The reason why is that in the sample D shown in FIG. 4, very strong absorption bands appear at 250 nm and 370 nm and a transmittance at 193 nm is 95.3%.

Therefore it is required that an average transmittance of the entire optical system is achieved which is about 98.0%/cm or more.

From the simulation experiments, in order to suppress reduction in a transmittance caused by irradiation of laser light at a tolerable level, it is found to be necessary that a total thickness of synthetic quartz glass as optical members at an energy density per pulse of 0.1 mJ/cm² of laser light is at least 50% or more of a total length of optical path through the entire optical system and in addition, a total length of optical path through fluorite optical members disposed in a region at an energy density is $0.4 \leq \epsilon$ of light is 25% or less of the total length of optical path of the entire optical system.

For calculation, it is assumed that optical path lengths are respectively are set at about 2 (50%): 1 (25%): 1 (25%) in ratio for optical path lengths at energy densities, small, medium and large.

From the experiments, a projection aligner comprising an optical system constructed from synthetic quartz glass optical members and fluorite optical members is expected to have a long lifetime with sufficient stability of optical properties in an actual operation.

As has been described, according to the present invention, a projection aligner with ArF excimer laser as light source using an optical system made of quartz glass containing hydrogen can be produced as the projection aligner with durability and no deterioration of optical properties at a low cost and with ease.

What is claimed is:

1. Optical system for integrated circuit fabrication, in which an integrated circuit pattern image is projected on a wafer using an excimer laser emitting ultraviolet light of a short wavelenght, comprising at least one crystalline optical member made of a single crystal fluorite and at least one amorphous optical member made of synthetic quartz glass, wherein said crystalline optical member is disposed in a first position closest to an exposing surface of a wafer and/or a pupil plane, which is position through which the laser light is transmitted at a relatively high light energy density $\epsilon$ (mJ/cm²) in a range of about $0.4 \leq \epsilon \leq 1.5$ mJ/cm², and said amorphous optical member is disposed in a second position remote from the exposing surface of a wafer and/or the pupil plane, which is position through which the laser light is transmitted at a relatively low light energy density $\epsilon$ (mJ/cm²) in a range of about $0.1 \leq \epsilon \leq 0.4$ mJ/cm² whereby the amorphous optical member is made of quartz glass having a hydrogen molecule concentration in the range of $1 \times 10^{17}$ molecules/cm³ to $5 \times 10^{18}$ molecules/cm³.

2. Optical system according to claim 1, wherein after irradiation with a pulsed laser light having a wavelength of 193 nm at an energy density per pulse of 50 mJ/cm² and at a pulse count of $1 \times 10^6$ the crystalline optical member has an internal transmittance of 98%/cm or more.

3. Optical system according to claim 2, wherein the birefringence of the amorphous optical member is lower than the birefringence of the crystalline optical member.

4. Optical system according to claim 2, wherein the crystalline optical member is made from a single crystal fluorite which has a homogeneity of refractive index Δn of $3 \times 10^{-6}$/cm or less and a birefringence of 2 nm/cm or less, and the amorphous optical member is made from a synthetic quartz glass which has a homogeneity of refractive index Δn of $2 \times 10^{-6}$/cm or less and a birefringence of 1 nm/cm or less.

5. Optical system according to claim 2, wherein the excimer laser is an ArF excimer laser emitting laser light having an oscillating wavelength width of 1.5 pm or less.

6. Optical system according to claim 1, wherein the birefringence of the amorphous optical member is lower than the birefringence of the crystalline optical member.

7. Optical system according to claim 6, wherein the crystalline optical member is made from a single crystal fluorite which has a homogeneity of refractive index Δn of $3 \times 10^{-6}$/cm or less and a birefringence of 2 nm/cm or less, and the amorphous optical member is made from a synthetic quartz glass which has a homogeneity of refractive index Δn of $2 \times 10^{-6}$/cm or less and a birefringence of 1 nm/cm or less.

8. Optical system according to claim 6, wherein the excimer laser is an ArF excimer laser emitting laser light having an oscillating wavelength width of 1.5 pm or less.

9. Optical system according to claim 1, wherein the crystalline optical member is made from a single crystal fluorite which has a homogeneity of refractive index Δn of $3\times10^{-6}$/cm or less and a birefringence of 2 nm/cm or less, and the amorphous optical member is made from a synthetic quartz glass which has a homogeneity of refractive index Δn of $2\times10^{-6}$/cm or less and a birefringence of 1 nm/cm or less.

10. Optical system according to claim 9, wherein it uses refractive optics comprising several amorphous optical members made of at least a first and a second quality of synthetic quartz glass, whereby the first quality has a hydrogen molecule concentration of at least $5\times10^{17}$ molecules/$cm^3$, and the second quality has a hydrogen molecule concentration of at least $1\times10^{17}$ molecules/$cm^3$.

11. Optical system according to the claim 10, wherein for the ArF excimer laser light having a wavelength of 193 nm the average transmittance of the optical system as a whole is about 98.0%/cm or more, the transmittance of the at least one amorphous optical member is 99.5%/cm or more and the transmittance for the crystalline optical member is 99.8%/cm or more, whereby at least one amorphous optical member belonging to the second quality is disposed in a region through which the laser light is transmitted at an energy density of $\epsilon \leq 0.1$ mJ/$cm^2$, and at least one amorphous optical member belonging to the first quality is disposed in a region, through which the laser light is transmitted at an energy density of $0.1 < \epsilon < 0.4$ mJ/$cm^2$, and the at least one crystalline optical member is disposed in a region, through which the laser light is transmitted at an energy density of $\epsilon \geq 0.4$ mJ/$cm^2$.

12. Optical system according to claim 11, wherein the optical system comprises an overall optical path length composed of total optical path lengths of the at least one crystalline optical member and of the at least one amorphous optical member, wherein the total optical path length of the at least one crystalline optical member is set at 25% or less of the overall optical path length and the total optical path length of the at least one amorphous optical member belonging to the second quality is set at 50% or more of the total optical path length.

13. Optical system according to claim 12, wherein the average variation of refractive index Δn of the optical system is set at a value of $\Delta n \leq 2.0 \times 10^{-6}$/cm.

14. Optical system according to claim 9, wherein the excimer laser is an ArF excimer laser emitting laser light having an oscillating wavelength width of 1.5 pm or less.

15. Optical system according to claim 10, wherein the excimer laser is an ArF excimer laser emitting laser light having an oscillating wavelength width of 1.5 pm or less.

16. Optical system according to claim 1, wherein the excimer laser is an ArF excimer laser emitting laser light having an oscillating wavelength width of 1.5 pm or less.

17. Optical system according to claim 16, wherein for the ArF excimer laser light having a wavelength of 193 nm the average transmittance of the optical system as a whole is about 98.0%/cm or more, the transmittance of the at least one amorphous optical member is 99.5%/cm or more and the transmittance for the crystalline optical member is 99.8%/cm or more, whereby at least one amorphous optical member belonging to the second quality is disposed in a region through which the laser light is transmitted at an energy density of $\epsilon \leq 0.1$ mJ/$cm^2$, and at least one amorphous optical member belonging to the first quality is disposed in a region, through which the laser light is transmitted at an energy density of $0.1 < \epsilon < 0.4$ mJ/$cm^2$, and the at least one crystalline optical member is disposed in a region, through which the laser light is transmitted at an energy density of $\epsilon \geq 0.4$ mJ/$cm^2$.

* * * * *